United States Patent [19]

Miller

[11] Patent Number: 5,529,051
[45] Date of Patent: Jun. 25, 1996

[54] METHOD OF PREPARING SILICON WAFERS

[75] Inventor: Anton J. Miller, Allentown, Pa.

[73] Assignee: AT&T Corp., Murray Hill, N.J.

[21] Appl. No.: 280,429

[22] Filed: Jul. 26, 1994

[51] Int. Cl.$^6$ .................................................. B28D 1/00
[52] U.S. Cl. ........................... 125/12; 125/13.01; 451/28; 451/41
[58] Field of Search ................................. 451/28, 41, 54, 451/56, 57, 67, 69, 70; 125/12, 13.01, 13.02

[56] References Cited

U.S. PATENT DOCUMENTS

| | | | |
|---|---|---|---|
| 4,127,969 | 12/1978 | Hoshi et al. | 451/41 |
| 4,331,452 | 5/1982 | Causey et al. | 451/41 |
| 4,343,662 | 8/1982 | Gay | 451/54 |
| 4,773,951 | 9/1988 | Moffatt et al. | 451/41 |
| 4,783,225 | 11/1988 | Maejima et al. | 451/41 |
| 4,905,425 | 3/1990 | Sekigawa et al. | 451/41 |
| 5,279,077 | 1/1994 | Miyashita et al. | 451/53 |

OTHER PUBLICATIONS

"Silicon Processing For The VLSI ERA", vol. 1, pp. 8–26. S. Wolf and R. N. Tauber, 1986. Lattice Press.

Primary Examiner—Maurina T. Rachuba
Attorney, Agent, or Firm—James H. Fox

[57] ABSTRACT

Silicon wafers oriented in the (100) crystal planes are sawed from a silicon ingot using the (111) faces on the as drawn silicon ingot as reference planes. The reference planes permit determination of the ingot orientation during the sawing process.

16 Claims, 1 Drawing Sheet

METHOD OF PREPARING SILICON WAFERS

TECHNICAL FIELD

This invention relates generally to the preparation of silicon wafers and particularly to the preparation of such wafers by cutting the ingot using the available primitive crystal faces on the silicon ingot as alignment marks for the crystallographic orienting and cutting process.

BACKGROUND OF THE INVENTION

Integrated circuit manufacture requires wafers as a basic starting material. At the present time, the silicon wafers used in integrated circuit fabrication are prepared using a highly developed process which will be briefly described so that the invention can be better understood. Silicon ingots are grown using the well known Czochralski growth technique which puts a seed crystal into molten silicon and then withdraws the seed crystal as the ingot grows. Either or both the ingot and crucible containing the molten silicon are rotated during ingot growth. Device considerations require that the wafers be (100) oriented wafers. The ingot orientation during the ingot sawing process is critical if the wafers are to have the desired (100) orientation. After the ingot is grown, the seed and tail ends of the ingot are removed. The ingot is ground to the desired diameter and transferred to x-ray diffraction apparatus where the (110) orientation is located and marked along the ingot with a line. The ingot is then returned to a grinding machine, and a flat centered on the marked line is ground to a prescribed width. The ingot is maintained in a stationary position during the flat grinding process. Of course, a notch or other feature may be ground or otherwise formed rather than a flat. The flat or notch may be made with a tolerance of approximately 1 degree. The ingot is mounted on a carrier plate, and a test wafer cut so that the (100) orientation may be determined by x-ray diffraction. Some correction may be required, and several test wafers may have to be cut before the desired orientation is obtained. See, for example, Silicon Processing for the VLSI Era, Vol. 1, pp. 8–26, S. Wolf and R. N. Tauber, 1986, Lattice Press, for a description of ingot growth and wafer preparation.

The process described is adequate today for many purposes although it does have some drawbacks. For example, examination of two test wafers is generally required before the desired ingot orientation of ±30 minutes of arc is obtained. Tighter orientation requirements will generally require more test wafers. The procedure, because of the number of test wafers that must be examined to achieve the ingot desired (100) orientation, contributes to the wafer cost. It is probable that as wafer diameters increase beyond the, at present, most widely used 150 mm diameter, the costs associated with ingot alignment, including flat grinding, will increase even more. Furthermore, single diffraction x-ray apparatus has a resolution limit of approximately ±10 minutes of arc. Better resolution may be obtained by using a double diffraction system which is, of course, more complex and expensive than is a single diffraction system. Furthermore, in addition to the costs associated with present alignment tolerances, future integrated circuits using smaller design rules, for example, 0.25 μm or smaller, than are commonly used in high volume manufacture today will require better control of wafer orientation than is required today. The requirement for better wafer orientation control is imposed by device considerations. For example, excessive roughness in thin gate oxides on epitaxial silicon can be related to wafer (100) misorientation and is undesirable. The oxide roughness may lead to, for example, current leakage through the gate oxide. Other examples of the need for better wafer orientation of both (100) and (110) exist. An orientation tolerance of ± a minute of arc will likely be required for (100).

SUMMARY OF THE INVENTION

In a preferred embodiment of this invention, a silicon ingot having a plurality of (111) crystal faces is mounted in finishing apparatus; and a plurality of (100) oriented wafers are sawed from the ingot using the (111) face as reference planes. The ingot is mounted in finishing apparatus during the sawing process. In another preferred embodiment, the ingot is mounted in finishing apparatus and a flat ground using the (111) faces as references planes.

According to a broader aspect of the invention, any crystal plane with known orientation on the ingot may be used as a reference plane. Additionally, the wafers may be sawed with orientations other than (100).

DETAILED DESCRIPTION

Figure 1:
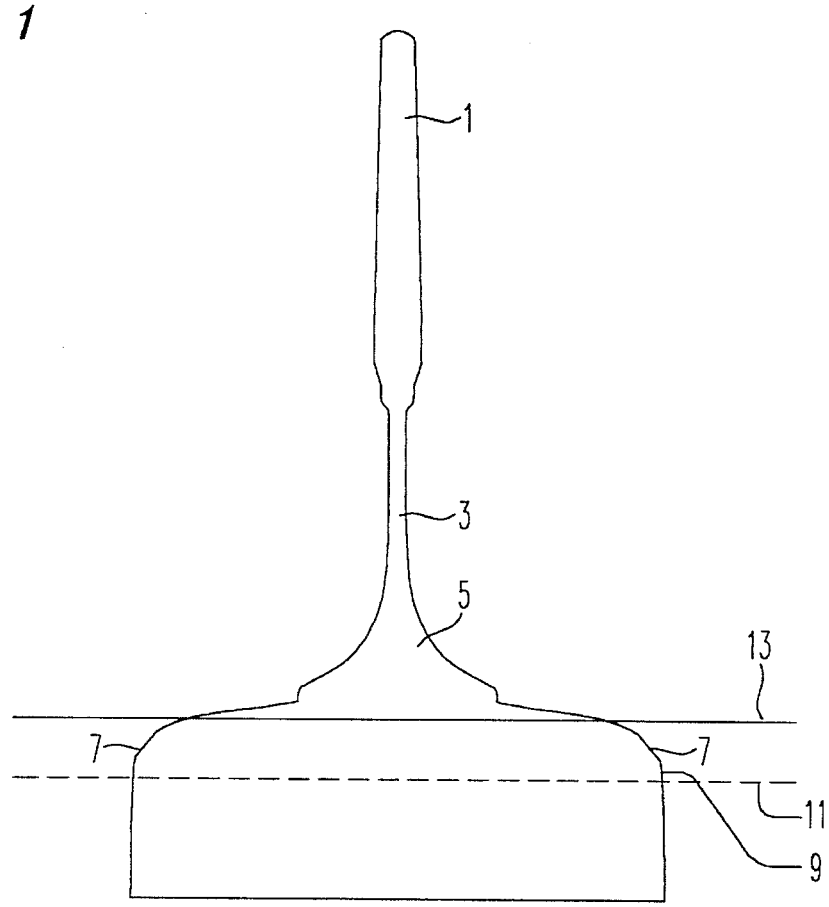
FIG. 1 is a side view showing the seed end of an as drawn silicon ingot.
Figure 2:
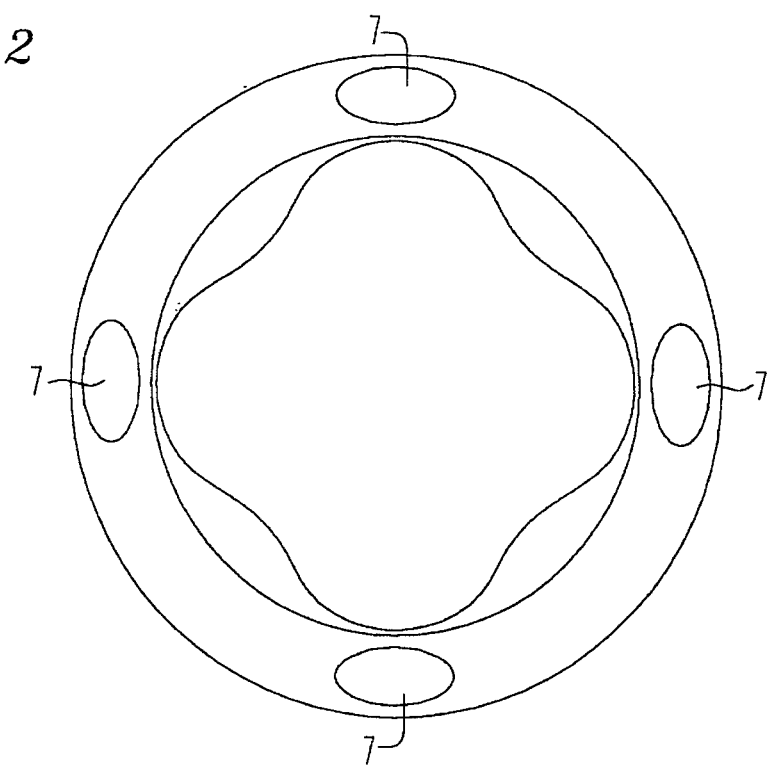
FIG. 2 is a top view of a silicon ingot after the cone and seed have been removed.

The invention will be described by reference to an exemplary embodiment. FIG. 1 is a side view showing the seed end of an as drawn silicon ingot. Shown are seed 1, neck 3, cone 5 and (111) faces 7 on the shoulder 9. Also shown by dotted line 11 is the plane at which the prior art removed the cone and seed prior to sawing the wafers. As is evident from FIG. 1, the cone and seed were removed below the shoulder and the (111) faces on the shoulder 9; that is, the (111) faces were removed. Present practice frequently seeks to minimize the size of the faces as the faces are removed before sawing begins and represent unused and therefore wasted silicon. Shown by solid line 13 is an exemplary plane at which this invention removes the cone and seed. The (111) faces 7 on shoulder 9 remain after the cone 5 and seed 1 are removed. FIG. 2 is a top view of the ingot after the cone and seed have been removed. The four (111) faces are depicted as is the (100) surface on the top of the ingot. The ingot will be readily grown by those skilled in the art. The shape of a typical (111) face is oval with a size that may be as large as 1 cm$^2$. The actual size and shape are related to the procedure used to grow the ingot and may be varied as needed. Faces larger than 1 cm$^2$ may ultimately be grown and used. Sizes and shapes vary consistently from ingot to ingot when consistent growth conditions are used. The size of the (111) faces can be controlled by expedient choice of initial growth conditions as is well known to those skilled in the art. Precise size will depend upon the optical measurement techniques used for measuring the orientation of the saw with respect to the ingot. Those skilled in the art will readily select faces of appropriate size for the practice of this invention.

The (111) faces are desirably used as references planes because of their optical properties; they are essentially optically perfect as evidenced by the fact that when they are tested with a certified optical reference tool or flat, the Newton fringes are absolutely straight. These optical properties make the faces ideally suited for use as reference planes during the crystallographic orienting and sawing operation.

After growth, the ingot is transferred to a grinding machine for cylindrical shaping to the desired diameter. However, the ingot is not transferred to x-ray diffraction apparatus to identify the (110) orientation. Rather, an, for example, opto-mechanical arrangement which is referenced to the radial position of the grinding wheel identifies the position of the (110) orientation by references to the (111) crystal faces on the shoulder. The flat or notch is now formed by grinding. The flat is used for wafer orientation during the various steps of downstream wafer processing into integrated circuits; it need not be used during the sawing process.

The alignment of the ingot onto the finishing apparatus, for example, the wafering saw uses the (111) faces for alignment. Different approaches for the alignment are possible; all approaches utilize the optical properties of the (111) faces including their high degree of crystallographic perfection. The alignment is between the (111) faces and part of the finishing apparatus such as a saw or a saw-grind system. In the case of the saw, the saw blade represents the machine or finishing apparatus based reference. In the case of saw-grind, a grinding wheel represents the finishing apparatus based reference. The needed optical reflection can be obtained by modifying a portion of the sawblade surface or grinding wheel. Any surface finishing technique, such as electropolishing, can be used if the apparatus does not already have a suitable portion.

The reference planes or finishing apparatus may be modified optically to simplify alignment by, for example, changing the angle of reflection from the reference planes. One approach attaches small, optically flat prisms with an effective angle of 34.5 degrees (the compliment angle of 55.5 degrees between the (111) and the (100) planes) to the optically flat (111) faces to build a common plane that can be aligned to either the reflective sawblade or grinding wheel. Monochromatic light can now be used for alignment. Alternatively, such small prisms or other beam deflecting structures are attached to a carder which is, in turn, attached to the sawblade or to the grinding wheel.

After alignment is complete, the sawing operation is performed. This technique is well known and description is not required. It will be appreciated that the method described permits quick and accurate alignment of the ingot and accurate sawing of wafers having a desired orientation.

Variations in the embodiments described will be readily thought of by those skilled in the art. For example, crystal faces other than (111) may be used for alignment.

I claim:

1. A method of preparing silicon wafers comprising the steps of:

mounting a silicon ingot having crystal faces of known orientation in finishing apparatus; and sawing a plurality of oriented wafers from said ingot using said crystal faces as reference planes, wherein said wafers have (100) orientation.

2. A method as recited in claim 1 in which said crystal faces have (111) orientation.

3. A method as recited in claim 1 further comprising: using part of said finishing apparatus as a reference.

4. A method as recited in claim 3 in which said using step uses a saw blade.

5. A method as recited in claim 3 in which said using step uses a grinding wheel.

6. A method as recited in claim 1 comprising the further step of:

optically modifying said reference planes or said finishing apparatus.

7. A method as recited in claim 6 in which said optically modifying step changes the angle of reflection of light from said reference plane.

8. A method as recited in claim 6 in which said optically modifying step changes the angle of reflection of light from said finishing apparatus.

9. A method of preparing silicon wafers comprising the steps of:

mounting a silicon ingot having crystal faces of known orientation in finishing apparatus; and sawing a plurality of oriented wafers from said ingot using said crystal faces as reference planes; and optically modifying said reference planes or said finishing apparatus.

10. A method as recited in claim 9 in which said optically modifying step changes the angle of reflection of light from said reference plane.

11. A method as recited in claim 9 in which said optically modifying step changes the angle of reflection of light from said finishing apparatus.

12. A method as recited in claim 9 in which said crystal faces have (111) orientation.

13. A method as recited in claim 9 which said crystal faces have (100) orientation.

14. A method as recited in claim 9 further comprising: using part of said finishing apparatus as a reference.

15. A method as recited in claim 14 in which said using step uses a saw blade.

16. A method as recited in claim 14 in which said using step uses a grinding wheel.

* * * * *